(12) United States Patent
Egner et al.

(10) Patent No.: US 7,710,146 B1
(45) Date of Patent: May 4, 2010

(54) HIERARCHICAL FPGA CONFIGURATION

(75) Inventors: Curtis J. Egner, Burnsville, MN (US);
James T. Seward, Edina, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 0 days.

(21) Appl. No.: 12/081,562

(22) Filed: Apr. 17, 2008

Related U.S. Application Data

(60) Provisional application No. 60/912,357, filed on Apr. 17, 2007.

(51) Int. Cl.
*G06F 7/38* (2006.01)
*H03K 19/173* (2006.01)

(52) U.S. Cl. ............................... 326/38; 326/39; 326/41

(58) Field of Classification Search ............. 326/38–41, 326/47
See application file for complete search history.

(56) References Cited

U.S. PATENT DOCUMENTS

| | | | |
|---|---|---|---|
| 6,550,022 B1 | 4/2003 | Faver | |
| 6,617,877 B1 | 9/2003 | Cory et al. | |
| 6,754,763 B2 | 6/2004 | Lin | |
| 7,397,272 B1 * | 7/2008 | Wennekamp | 326/38 |
| 2004/0130944 A1 | 7/2004 | Krause et al. | |
| 2005/0256969 A1 | 11/2005 | Yancey et al. | |
| 2005/0267729 A1 | 12/2005 | Poplack et al. | |
| 2007/0011542 A1 | 1/2007 | Mukherjee et al. | |
| 2008/0186052 A1 * | 8/2008 | Needham et al. | 326/38 |

OTHER PUBLICATIONS

"Xilinx System ACE CompactFlash Solution," Advance Product Specification, DS080, (v1.5), Apr. 5, 2002, pp. 1-69.

* cited by examiner

*Primary Examiner*—Anh Q Tran
(74) *Attorney, Agent, or Firm*—Steptoe & Johnson LLP

(57) ABSTRACT

A system for configuring programmable logic devices includes a serial data bus, a first device to fan-out data signals on the serial data bus, a second device to fan-in data signals on the serial data bus, and a control device that uses the first device and the second device to configure the serial data bus. The system configures a set of programmable logic devices by using the control device to configure the serial data bus such that the set of programmable logic devices are in communication with the serial data bus, and by sending configuration information to the set of programmable logic devices. A method for configuring programmable logic devices includes configuring a first programmable logic device such that the first programmable logic device includes signaling logic to fan-out configuration information, and using the first programmable logic device to configure at least two secondary programmable logic devices in parallel using the signaling logic to fan-out configuration information.

21 Claims, 4 Drawing Sheets

HIERARCHICAL FPGA CONFIGURATION

CROSS-REFERENCE TO RELATED APPLICATIONS

This application claims the benefit of U.S. Provisional Application No. 60/912,357 filed Apr. 17, 2007, which is hereby incorporated by reference in its entirety for all purposes.

TECHNICAL FIELD

Briefly, and in general terms, this disclosure relates to systems and methods for configuring programmable logic devices, such as, for example, field programmable gate arrays.

BACKGROUND

Programmable logic devices ("PLDs") are reconfigurable digital circuits, such as, for example, an erasable programmable read-only memory ("EPROM"), an electrically-erasable read-only memory ("EEPROM"), a programmable array logic ("PAL"), a complex programmable logic device ("CPLD"), a field-programmable gate array ("FPGA"), and the like. A single PLD can replace tens, hundreds, or even thousands of logic gates with a single integrated circuit.

Various techniques have been used to configure PLDs. For example, an EPROM is a non-volatile memory (i.e., it retains its configuration when power is turned off) that is typically erased by exposure to ultraviolet light, and programmed out-of-circuit using a device having a socket to receive the EPROM. A higher programming voltage is applied and a configuration is loaded and retained until the EPROM is erased and/or reprogrammed. While this technique works for PLDs having non-volatile memory, not all PLDs retain their configurations when powered down, such as, for example, FPGA (field programmable gate array) devices.

FPGA devices are traditionally configured using a local, non-volatile memory with static signal connections. During power-up, a configuration stored in the non-volatile memory or data storage device (e.g., a flash memory, hard drive, and the like) is loaded into the FPGA. Configuration information may be sent to an FPGA in parallel, loading multiple bits (usually one or more bytes) simultaneously, or it may be sent serially.

One way to configure an FPGA serially is by using extensions to a testing standard designed to facilitate and improve circuit-level testing that was developed by JTAG ("Joint Test Action Group") and standardized as IEEE 1149.1-2001 (commonly referred to as "JTAG"). Conventional testing of assembled printed circuit boards ("PCBs") involved placing the boards on a "bed of nails," forming an electrical connection between a testing device and each junction on the PCB. In this manner, the testing device could insert signals anywhere on the board and measure electrical properties (such as resistance and voltage). With the advent of multi-layer PCBs and surface-mounted components, the bed-of-nails testing approach proved inadequate. JTAG was formed to develop a testing standard adequate to handle developing technology. The JTAG solution was to place boundary cells around each component to be tested. These boundary cells are then serially chained together.

Xilinx™ offers a configuration solution called the Xilinx System ACE™, which uses an integrated circuit to configure any number of FPGAs using configuration data stored on a CompactFlash device or other non-volatile data storage device. Using the Xilinx™ solution, FPGAs are connected together in a JTAG chain and configuration data is serially passed from FPGA to FPGA.

FIG. 1 shows a system using JTAG-based PLD configuration, such as that used by Xilinx™ for FPGAs. In this system, a configuration controller 101 communicates with a configuration storage device 103 to retrieve information related to the configuration of a group of PLDs (105a, 105b, 105c) arranged in a JTAG chain. The configuration controller 101 passes the configuration information through the JTAG chain so as to configure each PLD (105a, 105b, 105c) in the chain.

While systems, such as that shown in FIG. 1, generally support the configuration of multiple PLDs (105a, 105b, 105c), they typically require that each PLD (105a, 105b, 105c) in a chain be powered up. As the number of PLDs used in digital systems increases, there is an increasing need for greater flexibility and control in PLD configuration.

SUMMARY

In a general aspect, a method for configuring programmable logic devices includes configuring a first programmable logic device such that that device includes signalling logic to fan-out configuration information, and using the first programmable logic device to configure at least two secondary programmable logic devices in parallel using the signalling logic to fan-out configuration information. The programmable logic devices may be implemented using any known or later developed technology, such as, for example, field-programmable gate arrays (FPGAs), programmable logic arrays (PLAs), programmable array logic (PAL), complex programmable logic devices (CPLDs), and the like. In some implementations, a multiplexer is used to fan-in signal paths from secondary programmable logic devices to the first programmable logic device. This process may be repeated for additional stages of programmable logic device configuration.

In another general aspect, a method for configuring programmable logic devices includes configuring a first set of programmable logic devices arranged on a serial data bus, using at least one of the first set of programmable logic devices to dynamically reconfigure the serial data bus to include a second set of programmable logic devices, and configuring the second set of programmable logic devices.

In some implementations, one or more of the first set of programmable logic devices is used to dynamically reconfigure the serial data bus to controlling a device to fan-in data signals transmitted on the serial data bus.

In another general aspect, a method for configuring programmable logic devices includes using a first device to fan-out data signals on a serial data bus, using a second device to fan-in data signals on the serial data bus, using the first device and the second device to reconfigure the serial data bus such that a first set of programmable logic devices is operably connected to the serial data bus, and configuring the first set of programmable logic devices using the serial data bus. The first and second devices may be implemented, for example, using a multiplexer, a programmable logic device, and the like. In this manner, it is possible, though not required, that programmable logic device be configured in stage such that some or all of the programmable logic devices may be powered down during earlier stages of configuration.

Additionally, implementations may configure further programmable logic devices using the first device and the second device to reconfigure the serial data bus such that a second set of programmable logic devices is operably connected to the serial data bus, and configuring the second set of programmable logic devices using the serial data bus.

In another general aspect, a system includes a configuration control device, a serial data bus including at least two configurations of connected devices, a configuration storage device in communication with the configuration control device and the serial data bus, a first programmable logic device in communication with the serial data bus and configurable to reconfigure the serial data bus, and at least two secondary programmable logic devices. The configuration control device uses a first configuration of the serial data bus to configure the first programmable logic device using data obtained from the configuration storage device, and uses the first programmable logic device to reconfigure the serial data bus such that the secondary programmable logic devices are in communication with the serial data bus. The configuration control device configures the at least two secondary programmable logic devices.

In some implementations, a JTAG bus is used as the serial data bus and a non-volatile memory is used as the configuration storage device. Further, the programmable logic devices are implemented as FPGAs.

In another general aspect, a system includes a serial data bus, a first device to fan-out data signals on the serial data bus, a second device to fan-in data signals on the serial data bus, and a control device that uses the first device and the second device to configure the serial data bus. The system configures a set of programmable logic devices by using the control device to configure the serial data bus such that the set of programmable logic devices are in communication with the serial data bus, and by sending configuration information to the set of programmable logic devices. By way of example, the first device may be implemented in and/or using a programmable logic device. In a preferred embodiment, the serial data bus is a JTAG bus and all programmable logic devices are FPGAs.

The details of one or more implementations are set forth in the accompanying drawings and the description below. Other features and advantages will be apparent from the description and drawings, and from the claims.

DETAILED DESCRIPTION

Figure 1:
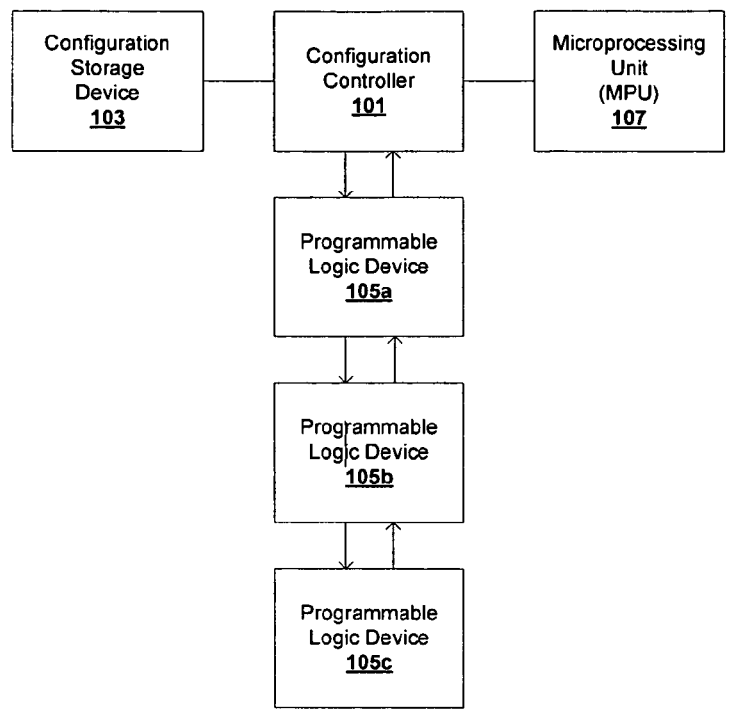
FIG. 1 is block diagram of a system for configuring multiple programmable logic devices according to the prior art.

Various embodiments disclosed herein are directed to systems and methods for configuring programmable logic devices. In some systems it may be desirable to apply the same configuration to multiple programmable logic devices ("PLDs"), and in some systems it may be desirable to configure programmable logic devices in stages. Using the techniques described herein, it is possible to configure any number of PLDs in any number of stages using a single control device. For example, implementations may provide for the hierarchical configuration of multiple programmable logic devices (PLDs), at different times. Additionally, implementations may provide for the configuration of multiple PLDs in parallel.

More particularly, various embodiments disclose centralizing the configuration data for multiple PLDs in a single non-volatile memory device. Further, the multiple PLDs are configured in stages, such that only active PLDs are involved in each configuration stage. Since only active PLDs are involved in a particular configuration stage, it is then possible to apply power to different PLDs at different times. Additionally, the disclosed embodiments provide for easier configuration binary management since each device type is configured individually in a separate configuration stage.

Referring now to the drawings, wherein like reference numerals denote like or corresponding parts throughout the drawings and, more particularly to FIGS. 2-5, there are shown various embodiments of a system and method providing for the hierarchical configuration of multiple programmable logic devices, wherein the devices are configured in stages.

Figure 2:
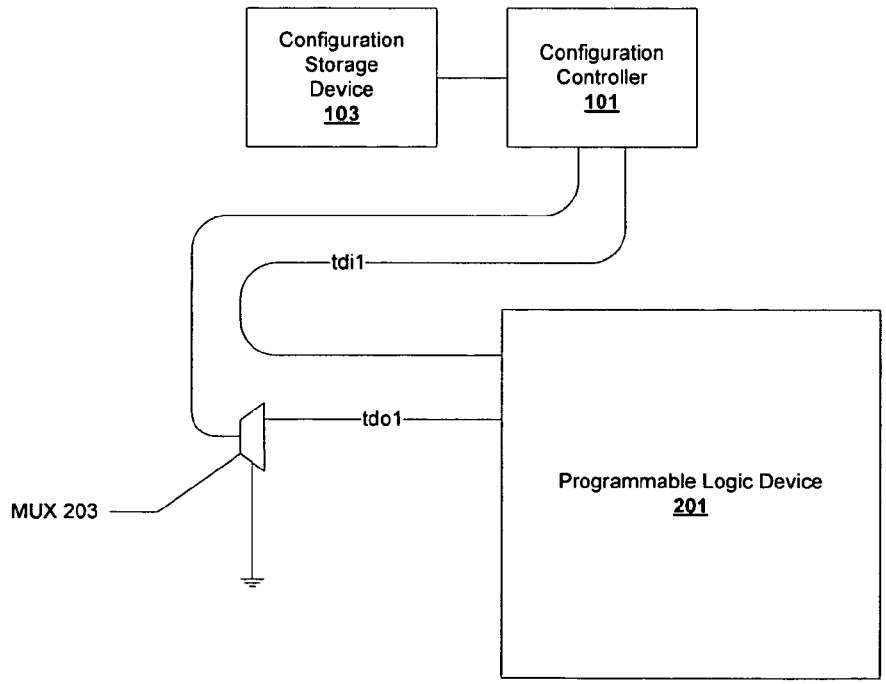
FIG. 2 is a block diagram illustrating the configuration of a first programmable logic device.

Referring to FIG. 2, a PLD configuration system is operable to configure a programmable logic device (PLD) 201. Those skilled in the art will appreciate that multiple devices may be configured, however, for illustrative purposes, only one programmable logic device is shown in this example embodiment of FIG. 2. However, in optional embodiments, multiple programmable logic devices may be used, wherein each serves a separate branch of devices for later steps in the configuration process. In FIG. 2, a configuration controller 101 is connected to a configuration storage device 103. A serial data bus connects the configuration controller 101 to the programmable logic device 201. Furthermore, this implementation includes a multiplexer 203 to select signals for transmission on the serial data bus. Those skilled in the art will appreciate that any combination of configuration storage device 103, configuration controller 101, and programmable logic device 201 may be used to implement the PLD configuration system.

Figure 3:
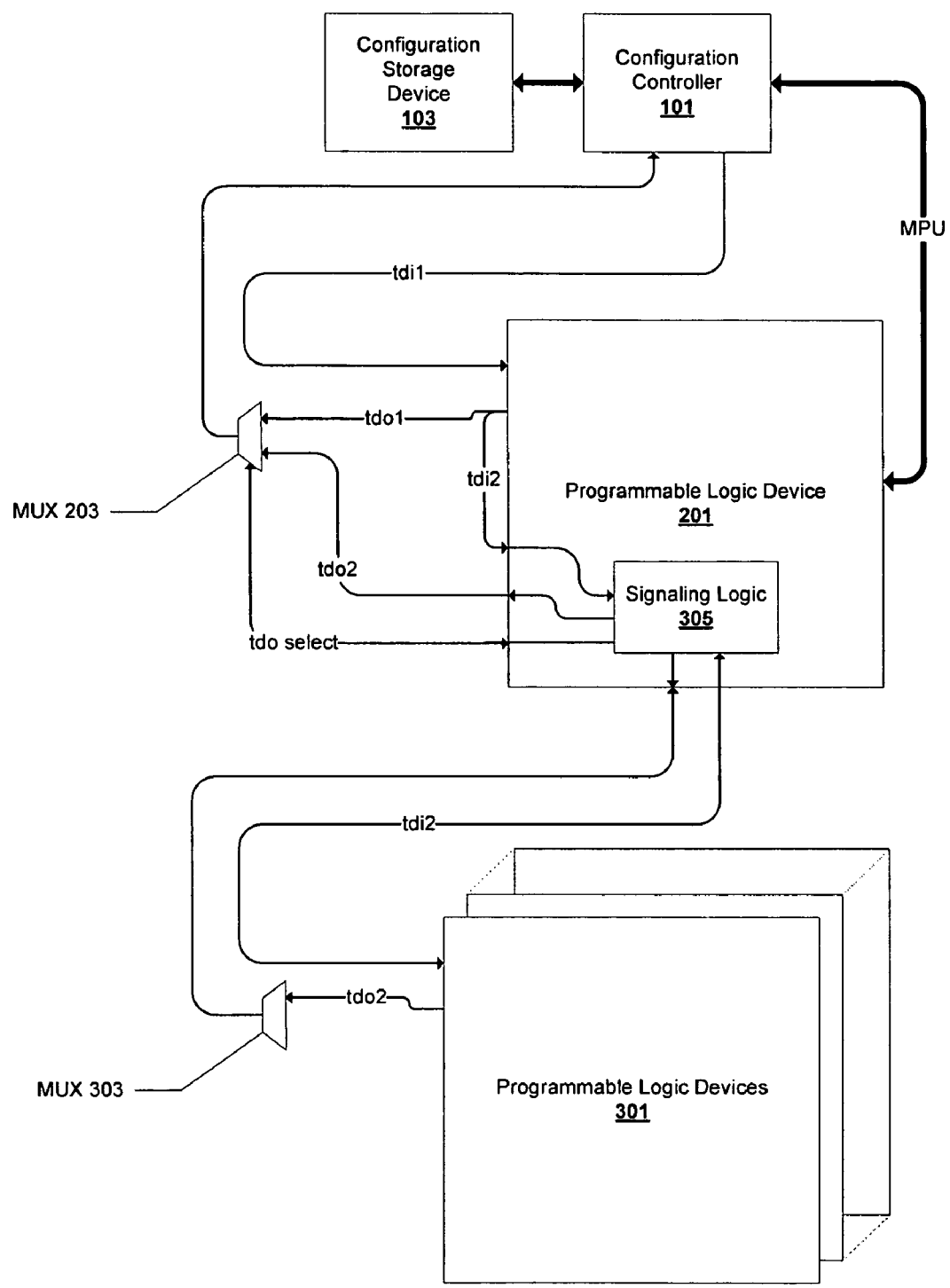
FIG. 3 is a block diagram illustrating a second stage of programmable logic device configuration.

A particular example embodiment of a hierarchical FPGA configuration system is illustrated in FIG. 3. More particularly, the hierarchical FPGA configuration system includes a configuration storage device 103 which is implemented using a Compact Flash memory show, a Xilinx™ a configuration controller 101 implemented using a System ACE Controller device, and the programmable logic device 201 implemented using a field-programmable gate array (FPGA) device.

Additionally, the configuration system uses JTAG as the serial data bus, wherein JTAG refers to the Joint Test Action Group and is the usual name used for the IEEE 1149.1-2001 standard entitled Standard Test Access Port and Boundary-Scan Architecture for test access ports used for testing printed circuit boards using boundary scan. Those skilled in the art will appreciate that any type of configuration interface may be used. The hierarchical FPGA configuration system further includes a first multiplexer 203, which is a combinational logic device with many input channels and typically one output. The multiplexer 203 connects one input channel at a time to the output. Those skilled in the art will appreciate the aforementioned example embodiment shown in FIG. 2 is merely an illustrative example, and any combination of configuration controller, configuration storage device, and serial data bus may be utilized.

Additionally, various embodiments are directed to extending the functionality of a FPGA configuration device in connection with a dynamic JTAG chain containing one or more FPGA devices. The dynamic JTAG chain allows for the addition of one or more devices, (such as but not limited to FPGA devices), to the JTAG chain. In comparison, traditional JTAG chains are static in nature and do not allow for the introduction of additional devices into a chain. Additionally, various embodiments also include a hub for routing the attached JTAG chains show. The extended functionality of the FPGA configuration devices supports redirecting and fanout of a JTAG data stream. Further, the extended functionality permits nesting of JTAG hubs and chains without requiring the generation of custom binaries for each depth and branch of the chain. Additionally, various embodiments provide the ability to configure many thousands, even millions, of FPGAs in parallel from a single non-volatile memory device, limited only by the amount of fanout supported and storage space for the number of unique configuration images needed.

In the example embodiment shown in FIG. 2, only JTAG data signals TDI (Test Data In) and TDO (Test Data Out) are shown. JTAG control TMS (Test Mode Select) and the test clock (TCK) are not shown in the example illustration of the implementation. However, in practice, those skilled in the art will appreciate that TMS and TCK would typically be connected to all JTAG devices in JTAG chains.

The example embodiment shown in FIG. 2 illustrates a first stage in the hierarchical FPGA configuration system. The first stage of configuration may be initiated automatically at power-on. Alternately, the first stage of configuration may be started by a separate control processor (not shown). In one embodiment, a multiplexer device 203 may be inserted on the TDO path with a pull down on the select signal. The multiplexer 203 ensures that the JTAG chain is valid for the first stage of configuration. Additionally, any other drivers of the select signal need to remain either 0 or in a high impedance state during the configuration of the PLD 201.

After PLD 201 has been configured and properly initialized, the next level of configuration may occur. Referring to FIG. 3, an example block diagram of the second stage of configuration is illustrated. In this example, a second group of PLD devices 301 are configured. The multiple PLD devices 301 are configured in parallel. The first programmable logic device 201 includes signalling logic 305 such that it acts as a JTAG hub to dynamically configure the serial data bus. As shown in FIG. 3, the serial data bus output tdo1 is connected to an input to the programmable logic device 201, further, an output from the PLD 201 is connected to multiplexer 203 as signal tdo2. The multiplexer 203 selects between signals tdo1 and tdo2 based on the value of the signal tdo select. One skilled in the art will appreciate that the signal tdo select may be controlled by the PLD 201 or by any other logic device, including a multiprocessor unit (MPU) (not shown).

The signalling logic 305 acts as a JTAG hub. The signalling logic 305 first controls the TDO select signal of the multiplexer 203 to select the TDO from the signalling logic 305 instead of the TDO from the PLD 201 itself. The signalling logic 305 then replicates and broadcasts the TDI signal to the second group of PLD devices 301 in parallel. In turn, the signalling logic 305 also reduces the multiple TDOs returning from the second group of PLD devices 301 and presents a single TDO back the configuration controller 101. In this example, the implementation of this reduction is application specific, but the assumption is that the TDO values are equivalent if all parallel configurations are occurring successfully. Exception situations are handled to ensure that the configuration controller 101 responds properly.

In one embodiment, a consequence of the signalling logic 305 is that the configuration controller 101 identifies a JTAG chain that consists of a first PLD 201 (in bypass mode) and one second PLD 301. The parallel array of multiple second PLDs 301 are hidden from the configuration controller 101, and therefore, does not need to be accounted for in configuration binary image creation.

Additionally, FIG. 3 shows an MPU interface to the configuration controller 101. The MPU interface initiates configuration for the remaining stages. Optionally, in one embodiment, the MPU interface controls do not come from the PLD 201 and instead are generated from another external control processor (not shown).

Figure 4:
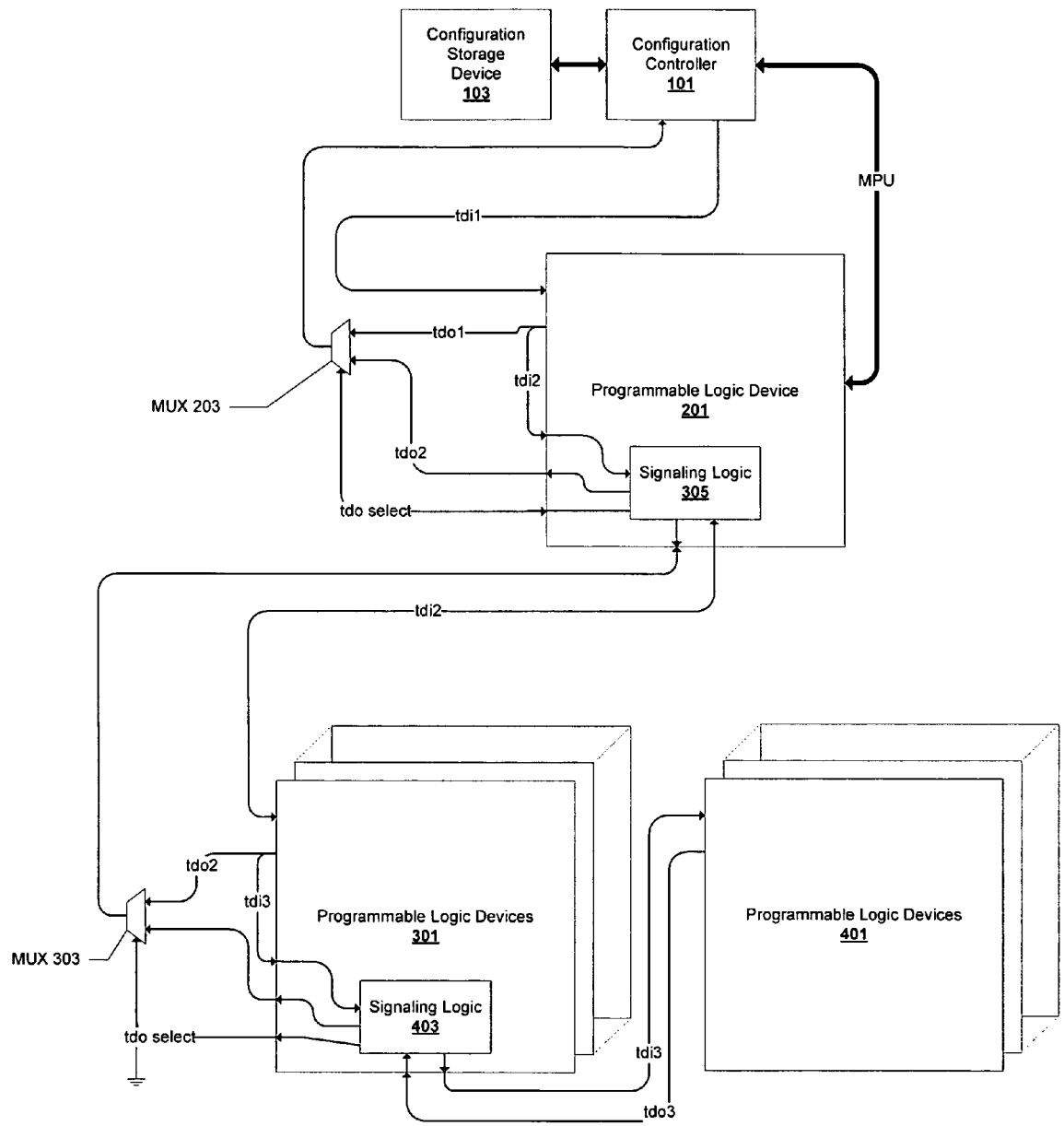
FIG. 4 is a block diagram illustrating an additional, optional stage of programmable logic device configuration.

Optionally, in one embodiment, if a logic device contains a hub mechanism, then another level of downstream logic devices may be configured. Referring to FIG. 4, the PLD devices 301 contain signalling logic 305. Additionally, if the PLD devices 301 need to control when to begin the configuration, the PLD devices 301 communicate back to the device controlling the configuration controller 101 via the MPU interface (e.g., PLD 201 or a control processor). In one embodiment, a consequence of the second signalling logic 305 is that the configuration controller 101 recognizes a JTAG chain that consists of one first PLD 201 (in bypass mode), one second PLD device 301 (in bypass mode), and one subsequent PLD device 401. The parallel array of PLD devices 401 are hidden from the configuration controller 101.

Further levels of configuration hierarchy may be provided by implementing further instances of a JTAG hub. In various embodiments, the number of levels is limited by the number of configuration binary images that may be stored in the memory device or storage system. Additionally, in various embodiments, the total number of FPGAs being configured in parallel is multiplied at each level of hierarchy. This can enable a very large number of identical FPGA devices to be configured at the same time.

Figure 5:
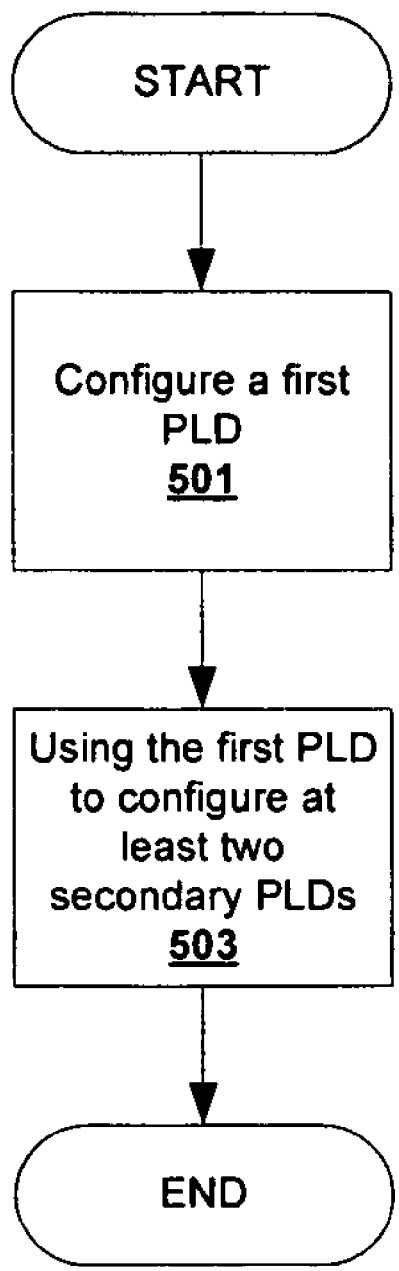
FIG. 5 is a flow chart of a method for configuring programmable logic devices.

Referring to FIG. 5, a method for configuring PLD devices includes configuring a first PLD (step 501) and using the first PLD to configure at least two secondary PLDs (step 503). The first PLD controls dynamically configures a serial data bus for communicating configuration information to the secondary PLDs. This process may be applied recursively, with later stages configured by the first PLD or one or more of the secondary (or later-stage) PLDs.

In another embodiment, the hierarchical FPGA configuration system includes a configuration path (e.g. JTAG) that is dynamic at each configuration stage and level of hierarchy. In other words, the logical device chain introduces and/or subtracts devices at each stage of configuration. Traditionally configuration paths are static and do not allow for the introduction or subtraction of devices. Optionally, in another embodiment, the data path multiplexer (e.g. the TDO mux) may be used to dynamically change the configuration interface.

Further, the logic devices are able to be powered on only as needed for their particular stage of configuration. The inactive devices are not involved in the current configuration stage and are not required to be powered or initialized. Additionally, the configuration control and data signal paths are broadcast to an array of devices and their returning signal paths are reduced to a single signal set.

In one embodiment, each stage of configuration represents only a single device type and configuration bit stream. Further, the large array of devices or hierarchical array of devices is configured in parallel. The array is easily scalable to add additional levels of hierarchy.

In an optional embodiment, the configuration data images are stored in a single memory or memory system.

One skilled in the art will appreciate that by using the fan-in and fan-out capabilities described herein, it is possible to configure an arbitrary number of PLD devices in one or more stages by configuring a serial data bus such that devices to be programmed are accessible, and then transmitting configuration information. In this manner, it is also possible to combine this technique with conventional PLD configuration techniques. For example, a JTAG chain may be created that appears to have three PLD devices for configuration. However, any of those three devices may be used to fan-out configuration information to multiple devices in parallel.

The various embodiments described above are provided by way of illustration only and should not be construed to limit the claimed invention. Those skilled in the art will readily recognize various modifications and changes that may be made to the claimed invention without following the example embodiments and applications illustrated and described herein, and without departing from the true spirit and scope of the claimed invention, which is set forth in the following claims.

What is claimed is:

1. A method for configuring programmable logic devices, the method comprising:
    configuring a first programmable logic device such that the first programmable logic device includes signaling logic to fan-out configuration information;
    using the first programmable logic device to configure at least two secondary programmable logic devices in parallel using the signaling logic to fan-out configuration information; and
    using a multiplexer to fan-in signal paths from the at least two secondary programmable logic devices to the first programmable logic device.

2. The method of claim 1, wherein configuring a first programmable logic device includes configuring a field-programmable gate array (FPGA).

3. A method for configuring programmable logic devices, the method comprising:
    configuring a first set of programmable logic devices arranged on a serial data bus;
    using at least one of the first set of programmable logic devices to dynamically reconfigure the serial data bus to include a second set of programmable logic devices; and
    configuring the second set of programmable logic devices.

4. The method of claim 3, further comprising:
    using at least one of the second set of programmable logic devices to reconfigure the serial data bus to include a third set of programmable logic devices; and
    configuring the third set of programmable logic devices.

5. The method of claim 3, wherein using the at least one of the first set of programmable logic devices to dynamically reconfigure the serial data bus includes controlling a device to fan-in data signals transmitted on the serial data bus.

6. A method for configuring programmable logic devices, the method comprising:
    using a first device to fan-out data signals on a serial data bus;
    using a second device to fan-in data signals on the serial data bus;
    using the first device and the second device to reconfigure the serial data bus such that a first set of programmable logic devices is operably connected to the serial data bus; and
    configuring the first set of programmable logic devices using the serial data bus.

7. The method of claim 6, further comprising:
    using the first device and the second device to reconfigure the serial data bus such that a second set of programmable logic devices is operably connected to the serial data bus; and
    configuring the second set of programmable logic devices using the serial data bus.

8. The method of claim 6, wherein using a first device to fan-out data signals on a serial data bus includes configuring a first programmable logic device to fan-out data signals on a serial data bus.

9. The method of claim 7, further comprising:
    powering up the second set of programmable logic devices after configuring the first set of programmable logic devices.

10. The method of claim 6, wherein the serial data bus is a JTAG bus.

11. A system comprising:
    a configuration control device;
    a serial data bus including at least two configurations of connected devices;
    a configuration storage device in communication with the configuration control device and the serial data bus;
    a first programmable logic device in communication with the serial data bus and configurable to reconfigure the serial data bus; and
    at least two secondary programmable logic devices,
    wherein the configuration control device uses a first configuration of the serial data bus to configure the first programmable logic device using data obtained from the configuration storage device, and wherein the configuration control device uses the first programmable logic device to reconfigure the serial data bus such that the at least two secondary programmable logic devices are in communication with the serial data bus, and wherein the configuration control device configures the at least two secondary programmable logic devices.

12. The system of claim 11, wherein the serial data bus is a JTAG bus.

13. The system of claim 11, wherein the configuration storage device is a non-volatile memory.

14. The system of claim 10, wherein the first programmable logic device and the at least two secondary programmable logic devices are field-programmable gate arrays.

15. A system comprising:
    a serial data bus;
    a first device to fan-out data signals on the serial data bus;
    a second device to fan-in data signals on the serial data bus; and
    a control device that uses the first device and the second device to configure the serial data bus,
    wherein the system configures a set of programmable logic devices by using the control device to configure the serial data bus such that the set of programmable logic devices are in communication with the serial data bus, and by sending configuration information to the set of programmable logic devices.

16. The system of claim 15, wherein the first device is a programmable logic device.

17. The system of claim 15, wherein the serial data bus is a JTAG bus.

18. A method for configuring programmable logic devices, the method comprising:
    configuring a first programmable logic device such that the first programmable logic device includes signaling logic to fan-out configuration information;
    using the first programmable logic device to configure at least two secondary programmable logic devices in parallel using the signaling logic to fan-out configuration information; and
    powering up the at least two secondary programmable logic devices after configuring the first programmable logic device.

19. The method of claim 18, wherein configuring a first programmable logic device includes configuring a field-programmable gate array (FPGA).

20. A method for configuring programmable logic devices, the method comprising:
- configuring a first programmable logic device such that the first programmable logic device includes signaling logic to fan-out configuration information;
- using the first programmable logic device to configure at least two secondary programmable logic devices in parallel using the signaling logic to fan-out configuration information; and
- using one or more of the at least two secondary programmable logic devices to configure additional programmable logic devices.

21. The method of claim 20, wherein configuring a first programmable logic device includes configuring a field-programmable gate array (FPGA).

\* \* \* \* \*